United States Patent [19]
Nam et al.

[11] Patent Number: 5,693,546
[45] Date of Patent: Dec. 2, 1997

[54] METHODS OF FORMING THIN FILM TRANSISTORS HAVING LIGHTLY-DOPED DRAIN AND SOURCE REGIONS THEREIN

[75] Inventors: Byeong-Yun Nam; Sang-Won Lee; Jin-Hong Kim, all of Kyungki-do, Rep. of Korea

[73] Assignee: Samsung Electronics Co., Ltd., Suwon, Rep. of Korea

[21] Appl. No.: 659,315

[22] Filed: Jun. 6, 1996

[30]         Foreign Application Priority Data

Jun. 12, 1995 [KR] Rep. of Korea ............ 95-15440

[51] Int. Cl.$^6$ ................................................ H01L 21/265
[52] U.S. Cl. ...................... 437/40; 437/41; 437/44
[58] Field of Search ......................... 437/40, 41, 42, 437/44, 101

[56]             References Cited

U.S. PATENT DOCUMENTS

| | | | |
|---|---|---|---|
| 4,971,922 | 11/1990 | Watabe et al. | 437/44 |
| 5,200,351 | 4/1993 | Hadjizadeh-Amini | 437/44 |
| 5,238,859 | 8/1993 | Kamijo et al. | 437/44 |
| 5,362,661 | 11/1994 | Kim | 437/40 |
| 5,449,635 | 9/1995 | Jun | 437/47 |
| 5,518,940 | 5/1996 | Hodate et al. | 437/41 |
| 5,563,440 | 10/1996 | Yamazaki et al. | 437/40 |

FOREIGN PATENT DOCUMENTS

| | | |
|---|---|---|
| 0216052 | 4/1987 | European Pat. Off. . |
| 0308382 | 12/1988 | Japan . |
| 0098143 | 4/1990 | Japan . |
| 0163580 | 6/1994 | Japan . |

*Primary Examiner*—John Niebling
*Assistant Examiner*—Michael S. Lebentritt
*Attorney, Agent, or Firm*—Bell, Seltzer, Park & Gibson

[57]             ABSTRACT

Methods of forming field effect transistors include the steps of forming a composite of layers including an amorphous silicon layer (a—Si), a silicon dioxide layer thereon and a silicon nitride layer on the silicon dioxide layer. A polycrystalline silicon conductive layer is then formed on the silicon nitride layer by depositing and patterning polycrystalline silicon. The polycrystalline silicon conductive layer is then oxidized using thermal oxidation techniques to form an oxide outerlayer. During this step, a portion of the polycrystalline silicon conductive layer will be consumed to define a gate electrode. Dopants of first conductivity type are then implanted into a top surface of the silicon nitride layer, using the oxide outerlayer and the gate electrode as a mask, to form relatively lightly doped preliminary source and drain regions in the amorphous silicon layer. The oxide outerlayer is then removed preferably using a buffered oxide etchant (BOE) solution which does not etch silicon nitride. Following this, dopants of first conductivity type are again implanted into the amorphous silicon layer, using the gate electrode as a mask. The second implantation step causes the formation of a field effect transistor having self-aligned source and drain regions, self-aligned lightly doped source and drain region extensions (LDS, LDD) and a channel region therebetween which has the same length as the gate electrode. By forming the channel region to have the same length as the gate electrode, improved device characteristics can be achieved.

10 Claims, 4 Drawing Sheets

METHODS OF FORMING THIN FILM TRANSISTORS HAVING LIGHTLY-DOPED DRAIN AND SOURCE REGIONS THEREIN

FIELD OF THE INVENTION

The present invention relates to semiconductor devices and methods of fabrication, and more particularly to field effect transistors and methods of forming field effect transistors.

BACKGROUND OF THE INVENTION

At present, the dominant methods for fabricating liquid crystal display devices (LCD) and panels are the methods based on amorphous silicon (a—Si) thin film transistor (TFT) technologies. Using these technologies, high quality image displays of substantial size can be fabricated using low temperature processes.

One method of forming thin-film transistors for LCD display devices is illustrated by FIGS. 1A–1G. In particular, FIG. 1A illustrates an amorphous silicon (a—Si) layer 102, which forms the active region of a thin-film transistor, an oxide layer 104 and a nitride layer 106 which can be sequentially deposited on the amorphous silicon layer 102. A gate electrode 108 is also provided by depositing and patterning polycrystalline silicon on the nitride layer 106. As illustrated by FIGS. 1B–1C, N-type impurities 107 are then implanted to form a first ion-implant region 110. Then, an oxide spacer layer 112 is deposited and patterned to form sidewall spacers, as illustrated by FIGS. 1D–1E. Finally, using the sidewall spacers as an implant mask, N-type impurities 113 are again implanted to form a second ion-implant region 114 having a higher doping concentration than the first ion-implant region 110. Unfortunately, the step of patterning the oxide spacer layer 112 can result in a nonuniform etching of the nitride layer 106, particularly if the oxide spacer layer 112 is thick. In addition, the amorphous silicon layer 102 can also be damaged during subsequent processing if a nonuniformly thick nitride layer 106 is etched using a plasma such as $CF_4/CHF_3$ or $SF_6$. This can result in the formation of thin-film devices having poor electrical characteristics.

Another method of forming thin-film transistors for LCD display devices is illustrated by FIGS. 2A–2H. In particular, FIG. 2A illustrates an amorphous silicon (a—Si) layer 202 and an oxide layer 204 and nitride layer 206 which can be sequentially deposited on the amorphous silicon layer 202. A gate electrode 208 is also provided by depositing and patterning polycrystalline silicon on the nitride layer 206. As illustrated by FIGS. 2B–2C, N-type impurities 207 are then implanted to form a first ion-implant region 210. Then, an oxide spacer layer 211 is formed by thermal oxidation of the gate electrode 208, as illustrated by FIG. 2D. As will be understood by those skilled in the art, the thermal oxidation of the gate electrode 208 consumes a portion of thickness of the gate electrode and shortens the gate electrode. Referring now to FIG. 2E–2F, a polysilicon layer 212 is then deposited and patterned to form sidewall spacers 212 on the sides of the oxide spacer layer 211. Finally, using the sidewall spacers 212 as an implant mask, N-type impurities 213 are again implanted to form a second ion-implant region 214 having a higher doping concentration than the first ion-implant region 210. The step of forming an oxide spacer layer 211 causes the gate electrode 208 to become shorter than the active channel region of the device which is defined between the first ion-implant regions 210. However, this shortening of the gate electrode causes a deterioration in the $I_d$ versus $V_{ds}$ characteristics of the field effect transistor.

Thus, notwithstanding these above methods of forming thin-film devices, there continues to be a need for methods of forming thin-film devices which do not suffer from the aforementioned limitations.

SUMMARY OF THE INVENTION

It is therefore an object of the present invention to provide improved methods of forming field effect transistors.

It is another object of the present invention to provide improved methods of forming thin-film field effect transistors for liquid crystal display devices.

It is a further object of the present invention to provide thin-film field effect transistors having improved electrical characteristics.

These and other objects, features and advantages of the present invention are provided by methods of forming field effect transistors which include the initial steps of forming a composite of layers including an amorphous silicon layer (a—Si), a silicon dioxide layer thereon and a silicon nitride layer on the silicon dioxide layer. A polycrystalline silicon conductive layer is then formed on the silicon nitride layer, for example, by depositing and patterning polycrystalline silicon. The polycrystalline silicon conductive layer is then oxidized using thermal oxidation techniques to form an oxide outerlayer. During this step, a portion of the polycrystalline silicon conductive layer will be consumed to define a gate electrode. Dopants of first conductivity type are then implanted into a top surface of the silicon nitride layer, using the oxide outerlayer and the gate electrode as a mask, to form relatively lightly doped preliminary source and drain regions in the amorphous silicon layer. The oxide outerlayer is then removed preferably using a buffered oxide etchant (BOE) solution which does not etch silicon nitride. Following this, dopants of first conductivity type are again implanted into the amorphous silicon layer, using the gate electrode as a mask.

The second implantation step causes the formation of a field effect transistor having self-aligned source and drain regions, self-aligned lightly doped source and drain region extensions (LDS, LDD) and a channel region therebetween which has the same length as the gate electrode. By forming the channel region to have the same length as the gate electrode, improved device characteristics can be achieved.

DESCRIPTION OF PREFERRED EMBODIMENTS

Figure 1A:
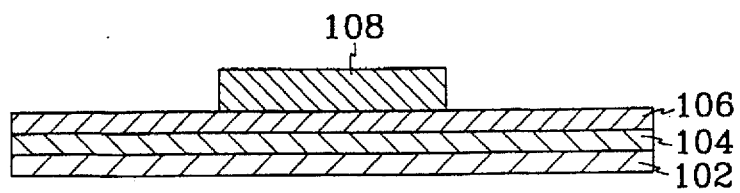
FIGS. 1A–1G illustrate schematic cross-sectional views of intermediate structures illustrating a method of forming a thin-film transistor (TFT), according to the prior art.
Figure 1B:
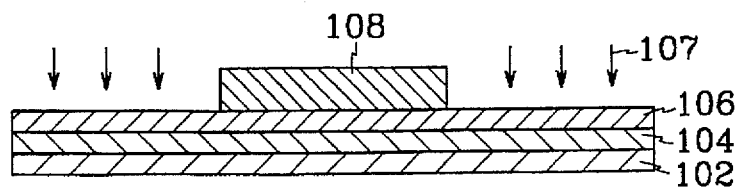
Figure 1C:
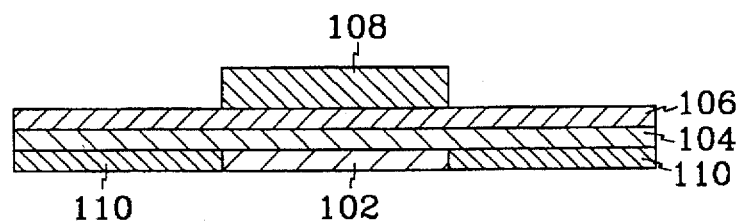
Figure 1D:
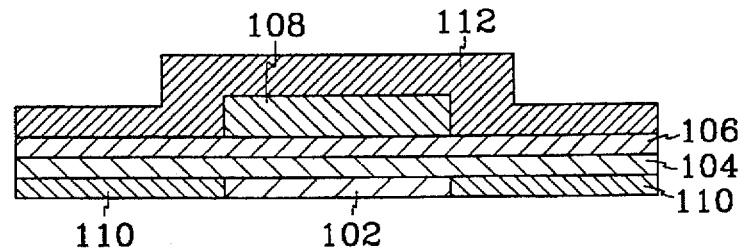
Figure 1E:
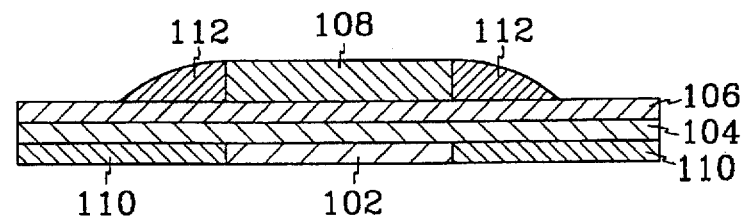
Figure 1F:
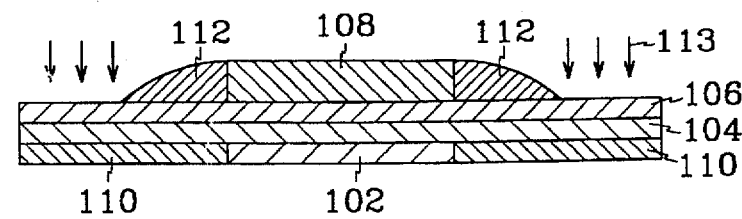
Figure 1G:
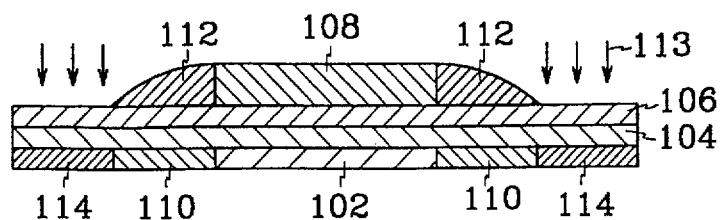

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

Figure 3A:
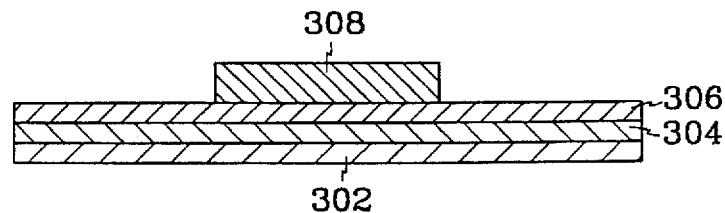
FIGS. 3A–3H illustrate schematic cross-sectional views of intermediate structures illustrating a method of forming a thin-film transistor, according to an embodiment of the present invention.

Referring now to FIGS. 3A–3H, methods of forming thin-film field effect transistors according to the present invention will be described. In particular, FIG. 3A illustrates a composite of layers comprising an amorphous silicon layer 302 (a—Si), a silicon dioxide layer 304 on the amorphous silicon layer 302 and a silicon nitride layer 306 on the silicon dioxide layer 304. Preferably, the amorphous silicon layer 302 is formed on an insulating substrate (not shown), such as a transparent substrate (e.g., glass), and then the silicon dioxide layer 304 and silicon nitride layer 306 are formed, in sequence, on the amorphous silicon layer 302 using conventional techniques. Referring still to FIG. 3A, a polycrystalline silicon conductive layer 308 is formed on the silicon nitride layer 306, for example, by depositing and patterning polycrystalline silicon.

Figure 3B:
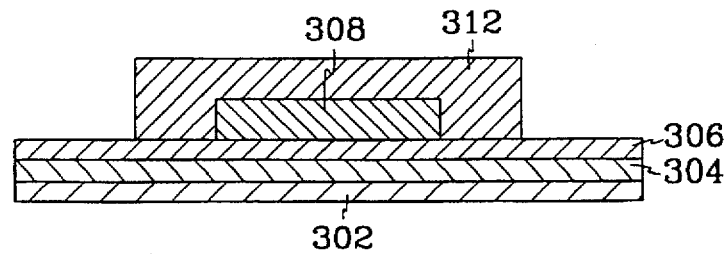

Referring now to FIG. 3B, the polycrystalline silicon conductive layer 308 is then oxidized using thermal oxidation techniques to form an oxide (e.g., SiO$_2$) outerlayer 312. During this step, a portion of the polycrystalline silicon conductive layer 308 will be consumed. Thus, the polycrystalline silicon conductive layer 308 should initially be formed with sufficient thickness and then patterned to sufficient length so that after the step of oxidizing the conductive layer 308, a gate electrode of preferred thickness and length results. As will be understood by those skilled in the art, the width of the conductive layer 308 as illustrated in cross-section in FIG. 3B is equal to the length of the gate electrode of the resulting transistor.

Figure 3C:
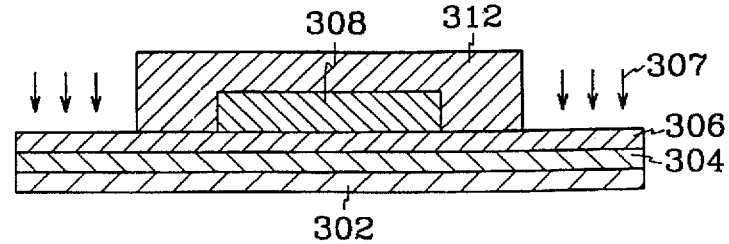
Figure 3D:
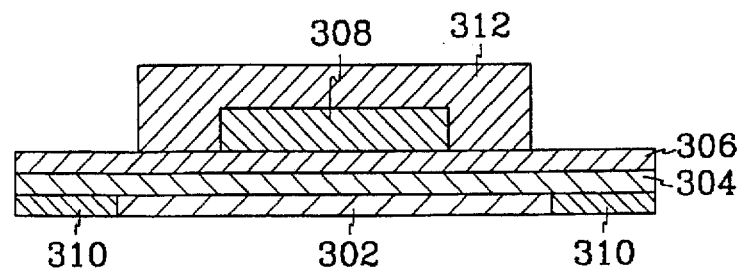
Figure 3E:
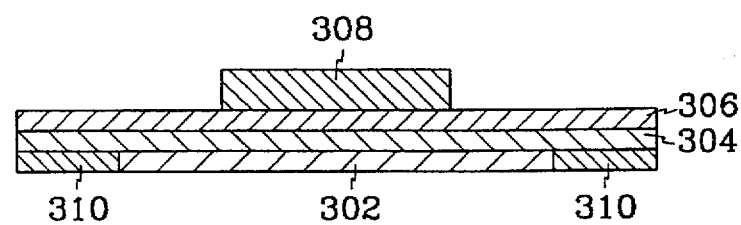
Figure 3F:
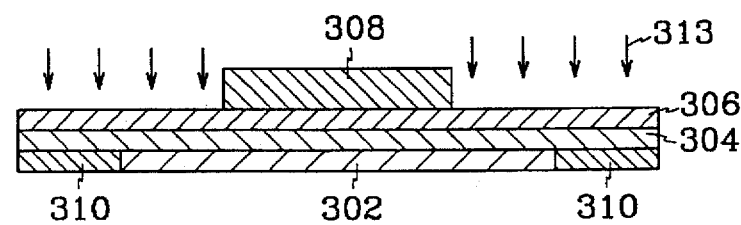

As illustrated by FIG. 3C, dopants 307 of first conductivity type (e.g., N-type) are then implanted into a top surface of the silicon nitride layer 306, using the oxide outerlayer 312 as a mask. As illustrated by FIG. 3D, the dopants 307 are implanted at a sufficient dose level and with sufficient energy to form relatively lightly doped preliminary source and drain regions 310 in the amorphous silicon layer 302. Then, the oxide outerlayer 312 is removed preferably using a buffered oxide etchant (BOE) solution which does not etch silicon nitride, as illustrated by FIG. 3E. Following this, dopants 313 of first conductivity type are again implanted into the amorphous silicon layer 302, using the gate electrode 308 as a mask, as illustrated by FIG. 3F.

Figure 2A:
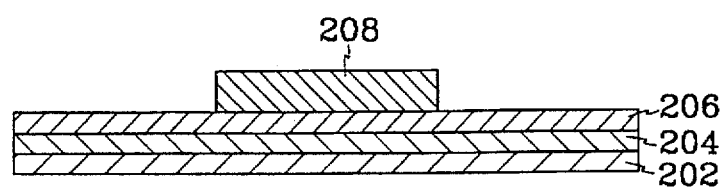
FIGS. 2A–2H illustrate schematic cross-sectional views of intermediate structures illustrating a method of forming a thin-film transistor, according to the prior art.
Figure 2B:
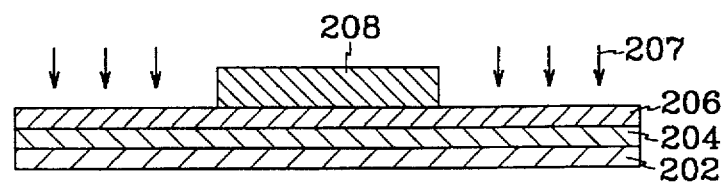
Figure 2C:
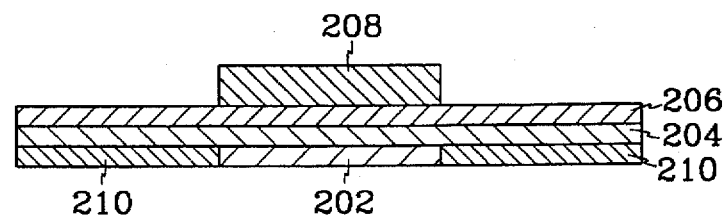
Figure 2D:
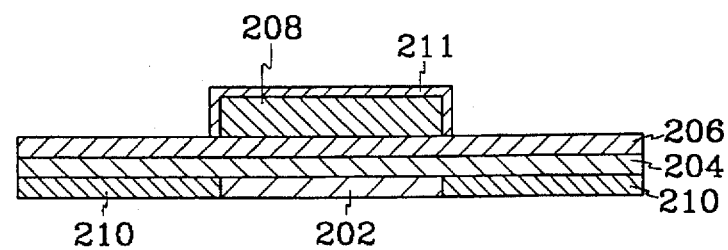
Figure 2E:
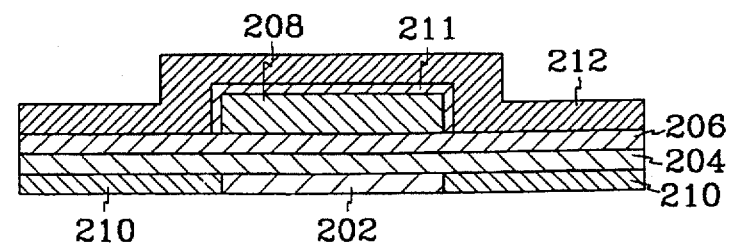
Figure 2F:
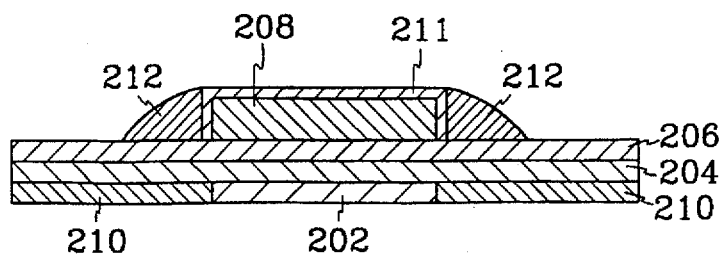
Figure 2G:
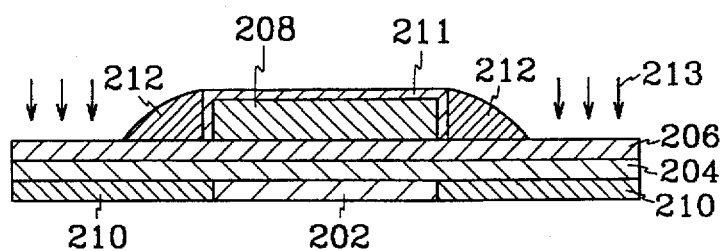
Figure 2H:
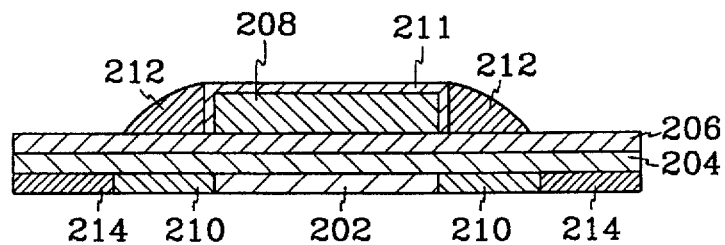
Figure 3G:
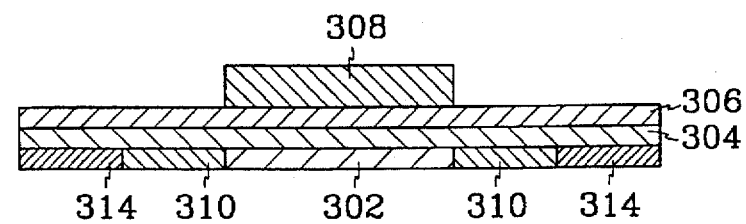
Figure 3H:
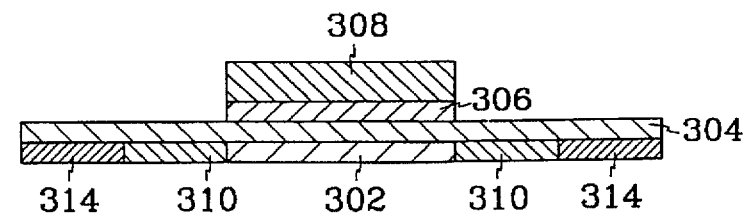

As shown by FIG. 3G, the second implantation step causes the formation of a field effect transistor having self-aligned source and drain regions 314, self-aligned lightly doped source and drain region extensions 310 and a channel region 302 therebetween. As illustrated, the channel region 302 has the same length as the gate electrode 308, which improves device characteristics. This is in contrast to the device of FIG. 2H, wherein the channel region 202 is longer than the gate electrode 208 because during the step of forming a thermal oxide layer 211, the gate electrode 208 is shortened relative to the already defined channel region 202. Referring now to FIG. 3H, the silicon nitride layer 306 can then be etched using a plasma containing CF$_4$ and CHF$_3$. Alternatively, the silicon nitride layer 306 can be etched prior to performing the second implantation step illustrated in FIG. 3F.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a thin-film field effect transistor, comprising the steps of:

forming an oxide layer on an amorphous silicon region;

forming a silicon nitride layer on the oxide layer, opposite the amorphous silicon region;

forming a conductive layer on the silicon nitride layer, opposite the oxide layer;

oxidizing the conductive layer to form a gate electrode having opposing edges and an oxide outerlayer on the opposing edges;

forming preliminary source and drain regions in the amorphous silicon region by implanting dopants through the oxide layer and the silicon nitride layer and into the amorphous silicon region using the gate electrode and oxide outerlayer as an implant mask;

removing the oxide outerlayer from the opposing edges of the gate electrode; and forming source and drain regions in the preliminary source and drain regions, respectively, and forming lightly doped source and drain region extensions between the source and drain regions by implanting dopants through the oxide layer and into the amorphous silicon region using the gate electrode as an implant mask.

2. The method of claim 1, wherein said conductive layer forming step comprises forming a polycrystalline silicon conductive layer on the silicon nitride layer.

3. The method of claim 2, wherein said source and drain regions forming step is followed by the step of etching the silicon nitride layer using the gate electrode as a mask.

4. The method of claim 2, wherein said source and drain regions forming step is preceded by the step of etching the silicon nitride layer using the gate electrode as a mask.

5. The method of claim 4, wherein said oxide outerlayer removing step comprises removing the oxide outerlayer using a buffered oxide etchant.

6. The method of claim 3, wherein said silicon nitride layer etching step comprises etching the silicon nitride layer with a plasma containing CF$_4$ and CHF$_3$.

7. A method of forming a field effect transistor having lightly doped source and drain region extensions, comprising the steps of:

forming an oxide layer on a semiconductor substrate;

forming a nitride layer on the oxide layer, opposite the semiconductor substrate;

forming a conductive layer on the nitride layer, opposite the oxide layer;

oxidizing the conductive layer to form a gate electrode having opposing edges and an oxide outerlayer on the opposing edges;

forming preliminary source and drain regions in the substrate by implanting dopants through the oxide layer and the nitride layer and into the substrate using the gate electrode and oxide outerlayer as an implant mask;

removing the oxide outerlayer from the opposing edges of the gate electrode; and forming source and drain regions in the preliminary source and drain regions, respectively, and forming lightly doped source and drain region extensions between the source and drain regions by implanting dopants through the oxide layer and into the substrate using the gate electrode as an implant mask.

8. The method of claim 7, further comprising the step of etching the nitride layer using the gate electrode as a mask prior to said step of forming source and drain regions in the preliminary source and drain regions.

9. The method of claim 1, wherein said step of oxidizing the conductive layer to form a gate electrode is preceded by the step of patterning the conductive layer.

10. The method of claim 7, wherein said step of oxidizing the conductive layer to form a gate electrode is preceded by the step of patterning the conductive layer.

* * * * *

UNITED STATES PATENT AND TRADEMARK OFFICE
CERTIFICATE OF CORRECTION

PATENT NO. : 5,693,546
DATED : December 2, 1997
INVENTOR(S) : Byeong-Yung Nam et al.

It is certified that error appears in the above-identified patent and that said Letters Patent is hereby corrected as shown below:

In Claim 5, line 1, "4" should read --3--.

Signed and Sealed this

Twenty-third Day of June, 1998

Attest:

BRUCE LEHMAN

Attesting Officer

Commissioner of Patents and Trademarks